(12) United States Patent
Lindgren

(10) Patent No.: US 7,312,164 B2
(45) Date of Patent: *Dec. 25, 2007

(54) SELECTIVE PASSIVATION OF EXPOSED SILICON

(75) Inventor: Joseph T. Lindgren, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 381 days.

This patent is subject to a terminal disclaimer.

(21) Appl. No.: 11/087,212

(22) Filed: Mar. 23, 2005

(65) Prior Publication Data

US 2005/0164500 A1    Jul. 28, 2005

Related U.S. Application Data

(63) Continuation of application No. 10/454,254, filed on Jun. 3, 2003, now Pat. No. 6,905,953, which is a continuation of application No. 10/218,268, filed on Aug. 13, 2002, now Pat. No. 6,593,221.

(51) Int. Cl.
*H01L 21/31* (2006.01)

(52) U.S. Cl. ............... 438/782; 438/612; 438/778; 438/787; 257/E21.507

(58) Field of Classification Search .............. None
See application file for complete search history.

(56) References Cited

U.S. PATENT DOCUMENTS

| | | | |
|---|---|---|---|
| 4,599,792 A | 7/1986 | Cade et al. | |
| 5,192,714 A | 3/1993 | Suguro et al. | |
| 5,256,593 A | 10/1993 | Iwai | |
| 5,365,112 A | 11/1994 | Oshima | |
| 5,395,645 A | 3/1995 | Kodera et al. | |
| 5,429,956 A | 7/1995 | Shell et al. | |
| 5,516,721 A | 5/1996 | Galli et al. | |
| 5,683,946 A | 11/1997 | Lu et al. | |
| 5,776,829 A | 7/1998 | Homma et al. | |
| 6,022,814 A | 2/2000 | Mikoshiba et al. | |
| 6,045,877 A | 4/2000 | Gleason et al. | |

(Continued)

OTHER PUBLICATIONS

Schreiber, S.J., et al., "Low Temperature Deposition of Microcrystalline Silicon for Thin Fim Transistors," CUED Electronic Devices and Materials Group, http://www2.eng.cam.ac.uk/-www-edm/projects/lowtempdep/1.htm,prior to Sep. 2000, 2 pages.

(Continued)

*Primary Examiner*—Michael Lebentritt
*Assistant Examiner*—Cheung Lee
(74) *Attorney, Agent, or Firm*—TraskBritt

(57) ABSTRACT

A method for applying a passivation layer selectively on an exposed silicon surface includes use of a liquid phase solution supersaturated in silicon dioxide. The application is conducted at substantially atmospheric temperature and pressure and achieves an effective passivation layer in an abbreviated immersion time, and without subsequent heat treatment. In one embodiment, rapid coating of a wafer back side with silicon dioxide permits the use of a high-speed electroless process for plating the bond pad with a solder-enhancing material. In another embodiment, the walls of via holes and microvia holes in a silicon body may be passivated by applying the supersaturated solution prior to plugging the holes with conductive material.

37 Claims, 4 Drawing Sheets

U.S. PATENT DOCUMENTS

| | | | |
|---|---|---|---|
| 6,130,116 | A | 10/2000 | Smith et al. |
| 6,174,824 | B1 | 1/2001 | Michael et al. |
| 6,197,110 | B1 | 3/2001 | Lee et al. |
| 6,251,753 | B1 | 6/2001 | Yeh et al. |
| 6,294,832 | B1 | 9/2001 | Yeh et al. |
| 6,335,224 | B1 | 1/2002 | Peterson et al. |
| 6,399,494 | B1 | 6/2002 | Nagata |
| 6,593,221 | B1 | 7/2003 | Lindgren |
| 6,671,947 | B2 | 1/2004 | Bohr |
| 6,905,953 | B2* | 6/2005 | Lindgren .................... 438/612 |
| 2002/0090813 | A1* | 7/2002 | Chien ........................ 438/638 |
| 2003/0201536 | A1* | 10/2003 | Ueno ........................ 257/750 |

OTHER PUBLICATIONS

Niskanen, Sampo, "Development of Liquid Phase Deposition of Sirconium Oxide and Comparison to Silicon Dioxide," http://sampo. Rdx.net/LPD/lpd.html, Nov. 19, 2000, 15 pages.

Niskanen, Antti J., "Liquid Phase Deposition of Silicon Dioxide," http://...Liquid Silicon Dioxide. htm+liquid+phase+Silicon+Dioxide+deposition&hl=en&start=, prior to Nov. 2000, 2 pages.

Yeh, Ching-Fa et al., "Properties of Silicon Exide Prepared by Liquid-Phase Deposition," Mar. 26, 1999, 1 page.

* cited by examiner

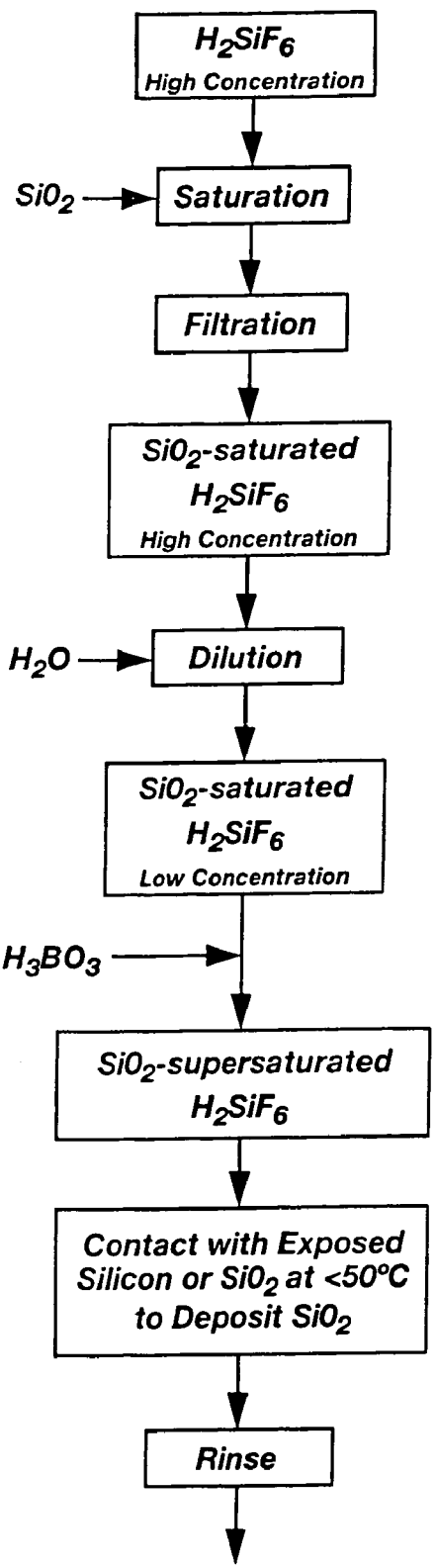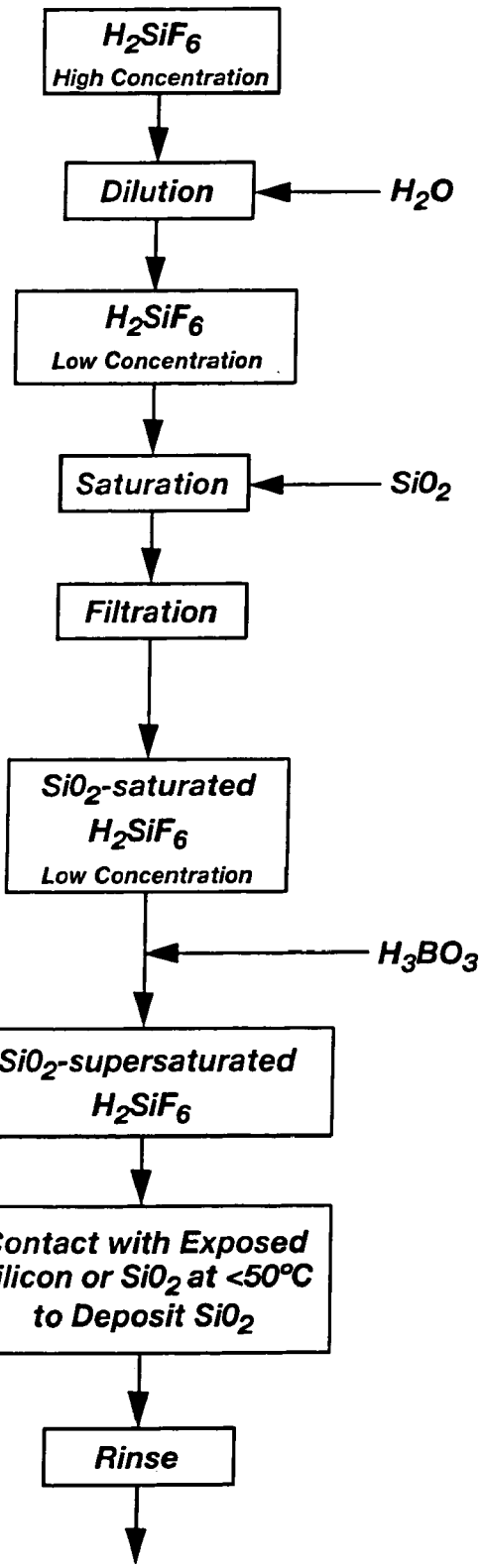
Fig. 4                    Fig. 5

SELECTIVE PASSIVATION OF EXPOSED SILICON

CROSS-REFERENCE TO RELATED APPLICATIONS

This application is a continuation of application Ser. No. 10/454,254, filed Jun. 3, 2003, now U.S. Pat. No. 6,905,953, issued Jun. 14, 2005, which is a continuation of application Ser. No. 10/218,268, filed Aug. 13, 2002, now U.S. Pat. No. 6,593,221, issued Jul. 15, 2003.

BACKGROUND OF THE INVENTION

1. Field of the Invention

The present invention relates to methods for electrically isolating dielectric materials. More particularly, the invention pertains to methods for electrical isolation, i.e., passivation of exposed silicon such as occurs on the back side of a semiconductor (SC) wafer comprising semiconductor devices or dice of a DRAM, SRAM, or other semiconductor die configuration. The invention also pertains to passivation of apparatus such as carrier substrates, interposer substrates for flip-chip packaging, conductive interconnects for test packages, and the like.

2. Background of Related Art

Silicon is a basic material from which a broad range of semiconductor devices is composed. Silicon is a semiconductor while its oxidation product, silicon dioxide, acts as a dielectric (insulating) material. Thus, silicon dioxide is one of the classical insulators used to electrically isolate silicon from conductive leads, specific functional devices in electronic apparatus, and the atmosphere. Other insulators that are used include a variety of organic and inorganic compounds.

The manufacture of semiconductor devices is performed by forming a plurality of the functional devices on a wafer and subsequently separating each semiconductor device by cutting along a pattern of saw lines crisscrossing the wafer. The various processes for forming a semiconductor device such as a DRAM or SRAM device may be generally characterized as including crystal growth, bare wafer formation, surface preparation, oxidation/nitridation, heat treatment, patterning, layer deposition, doping, metallization, and packaging. Typically, each of these processes includes several subprocesses.

Layer deposition is generally performed by one of several processes, such as physical vapor deposition (PVD), chemical vapor deposition (CVD), sputtering, and electron-beam evaporation. In cases where the desired layer is to be an oxide of the base material, e.g., silicon dioxide, another common method includes the direct thermal oxidation of the existing silicon surface. Although the processes by which "growth" of a passivation layer on silicon by oxidizing the surface are highly developed, they have certain limitations. First, the rate of formation significantly slows as the layer thickness increases. Long times at high temperature are generally required to form thick layers, such as field oxides, surface passivation layers, and some masking oxide layers. Secondly, the growth rate is a function of wafer orientation. The <111> planes of a wafer have more silicon atoms than <100> planes, thus leading to faster formation of a $SiO_2$ layer. In addition, other factors affecting growth rates include the types and concentrations of doping materials in the silicon and the presence of polysilicon or impurities. Differential oxidation causes the resulting $SiO_2$ layer to have a stepped surface. It should be noted that the initial costs and operating costs of oxidation furnaces are high. Furthermore, a problem, which must be considered in thermal oxidation, is the formation of surface dislocations which may cause circuit problems.

Another consideration relating to oxide growth is the inability to adequately passivate the lateral walls of a small via hole (such as a laser-formed microvia) of a multilayer device prior to deposition of a conductive material (such as tungsten) into the via hole. Present passivation methods for insulating the lateral walls of such small-diameter holes tend to produce uneven coverage, sometimes leading to either short circuits between the conductive via and the semiconductor or excessive filling of the via hole.

In forming semiconductor devices, the electrically conductive bond pads on the active surface are grounded to the back side of the wafer. Unless neutralized by a passivation layer, the wafer back side has a net positive (+) charge.

Bond pad formation typically includes applying a copper or aluminum base, then coating the base with another material so that wire bonds or conductive structures, such as solder, may be secured to the bond pad.

In the case of bond pads to which bond wires are to be secured, copper is typically employed as the bond pad material. As copper forms a "slippery" oxide that is difficult to remove with a wire bonding capillary, nickel and gold adhesion layers are typically used. As copper alone will not initiate the adhesion of nickel thereto, a palladium "strike," or seed layer, is typically formed prior to conducting an electroless nickel-plating process.

Efforts have been made to use more aggressive plating chemistries in order to speed the plating rate and create a higher density coating at lower cost. Such chemistries, e.g., palladium chloride in hydrochloric acid, greatly enhance the plating rate and plate density. However, unless the wafer back side is first passivated, copper pads which communicate with the silicon substrate (e.g., pads that communicate with active-device regions of transistors) and, thus, which may form a circuit directly through the silicon substrate, may be attacked by the plating chemistry and dissolve in as little as several minutes of exposure, resulting in damaged pads with performance anomalies. In addition, bath chemicals will be inordinately consumed. The use of sulfuric acid in the palladium electroless plating solution may curb such an attack of the bond pads to some extent, but does not completely resolve this problem. Once the palladium strike has been formed, nickel may be plated onto the copper and palladium by way of electroless deposition processes, then a gold layer may be formed by immersion plating processes.

Aluminum is typically used as the base metal for bond pads that will receive solder balls or other discrete conductive elements. As aluminum is not itself solderable, adhesion layers are typically deposited onto aluminum bond pads. Again, nickel is often used as such an adhesion layer. Nickel does not, however, adhere well to aluminum. A zincating process, usually "double zinc," is typically used to facilitate adhesion of electrolessly deposited nickel to aluminum. If the back side of the silicon substrate upon which the bond pads are carried is not adequately passivated, the zincating process may etch the aluminum bond pads or deposit large zinc grains, which, in turn, adversely affects the subsequently deposited nickel layer.

Moreover, in forming adhesion layers on both copper and aluminum bond pads, if the back side of the silicon substrate is not sufficiently passivated, these nickel and gold layers may also be loosely deposited onto portions of the back side, which may result in the formation of particles in the plating baths, shortening the lives thereof and creating potential problems for downstream processes which are particle-sensitive, such as subsequent tape and probe processes.

In the current state of the art, the general approach is to continue to use the more benign electroless plating method despite its overall cost.

In an alternative approach, a back side coating such as a photoresist material is first applied to the wafer back side to cover the wafer's substrate material, e.g., silicon or germanium, and provide protection from a more aggressive plating chemistry. This method has further disadvantages in that the wafer is required to be removed from its work surface and inverted for resist application by a spin-on technique. Inversion and spin-on deposition require extra steps and equipment, are time consuming, and require forcibly clamped placement of the wafer's active surface on the flat surface of a vacuum hold-down tool, sometimes leading to physical damage to the semiconductor devices being formed on the wafer.

In U.S. Pat. No. 6,022,814 to Mikoshiba et al., a method for forming a silicon dioxide layer is presented that includes the spin-coating of a resin compound having an O—COOH+O, Si—O, or Si—N backbone. After application, the coated surface is heat-treated to set the resin, followed by heating at between 250° C. and the glass transition point (~450-500° C. for 3 to 4 hours to form silicon dioxide. This method for forming a silicon dioxide layer suffers from the spin-coating disadvantages listed above. In addition, it requires significant furnace exposure at elevated temperatures.

It is desired to have a semiconductor manufacturing method to plate bond pads to achieve uniform high-quality, high-density pads. It is further desired to have such bond pad formation without wafer inversion, while minimizing chemical usage, minimizing time consumption, and reducing the use of high-cost equipment. In addition, it is desired to have a method to produce such semiconductor devices at an optimally high yield.

In a paper of Antti J. Niskanen, published prior to November 2000 and titled LIQUID PHASE DEPOSITION OF SILICON DIOXIDE, the author briefly summarizes tests to determine the possibility of liquid phase deposition of silicon dioxide. In a paper of Sampo Niskanen, dated November 2000 and titled DEVELOPMENT OF LIQUID PHASE DEPOSITION OF ZIRCONIUM OXIDE AND COMPARISON TO SILICON DIOXIDE, a summary is presented of tests comparing liquid phase depositions of zirconium dioxide and silicon dioxide to form thin films.

SUMMARY OF THE INVENTION

The present invention is a method for selectively forming a dense layer of passivating oxide, e.g., silicon dioxide or zirconium oxide, onto an exposed semiconductor wafer surface, e.g., silicon or germanium. The layer is applied by submersion of the exposed semiconductor wafer surface in a liquid at low or ambient temperature. The passivation layer of easily controlled thickness may be formed in a limited amount of time. The method differs from conventional high-temperature thermal oxidation, chemical vapor deposition, and spin-on passivation methods, each of which requires sophisticated equipment and high manpower costs. The method does not require inversion of a semiconductor wafer such as required by prior art back side deposition using spin-on deposition, nor does it require protracted heating at a high temperature to cure the layer.

The present invention is directed to the application of a silicon dioxide layer on an exposed silicon layer. The deposition is selective to silicon/silicon dioxide and may be performed by exposure to a liquid phase composition in a bath at room temperature or a temperature somewhat above room temperature, e.g., up to about 50° C. The liquid phase composition is supersaturated in silicon dioxide. The silicon dioxide deposition rate is not self-limiting, that is, it does not depend upon the layer thickness. The deposition rate may be readily controlled to provide repeatedly uniform layer thickness. Thus, for example, the method may be used to passivate the back side of a wafer or other semiconductor substrate without inverting the wafer or substrate. The method is specific to the base substrate, e.g., silicon and its oxide. Further exclusion of oxide from other surfaces may be assured by, for example, covering such surfaces with tape. Any silicon dioxide pre-existing on the silicon surface may be first removed or, alternatively, left in place for oxide deposit thereover.

In one embodiment of the invention, a silicon wafer is formed for the purpose of producing a plurality of semiconductor devices, e.g., DRAM semiconductor devices, SRAM semiconductor devices or other types of semiconductor devices. After forming the semiconductor devices on the active surface of the wafer, covering the semiconductor devices with an insulative layer, and forming conductive traces on each semiconductor device, bond pads are formed to connect the traces (generally copper, aluminum, or alloys thereof) to external connectors (via wire bonds, for example). Prior to forming the bond pads by an electroless method, the wafer is submerged in a bath of supersaturated silicon dioxide at room temperature or somewhat higher, up to about 50° C., by which exposed silicon on the wafer back side becomes covered with a passivating layer of silicon dioxide.

The exposed copper or aluminum metallization at each bond pad location may then be coated with immersion palladium or zinc, followed by an electroless nickel and, optionally, immersion gold, in a bath to form pads amenable to soldering or another joint with an external conductor. For example, the bond pads may then be coated with gold or solder-bonded to conductive wires. The overall process results in devices which are produced at reduced time and expense and which are more reliable than those currently produced.

The liquid bath is supersaturated with respect to an oxide of a material which is capable of forming a hexafluoro salt. This includes, for example, silicon, zirconium, iron, and vanadium. In this invention, the primary passivation material of interest is silicon dioxide, but other oxides may also be used.

The liquid bath of saturated silicon dioxide is formed by adding silicon dioxide and water to hexafluorosilicic acid $H_2SiF_6$. The solution may be diluted with water either before or after silicon dioxide is added to the saturation point. Boric acid ($H_3BO_3$) is then added to supersaturate the liquid in silicon dioxide. The silicon dioxide selectively precipitates onto the silicon/silicon oxide surface as a dense cohesive layer of uniform thickness.

In addition to the application for enhancing bond pad plating, the method of the invention is applicable to the passivation of vias and microvias and to forming other layers on exposed silicon, such as on a semiconductor device wafer, interposer wafer, etc.

BRIEF DESCRIPTION OF THE SEVERAL VIEWS OF THE DRAWINGS

The nature of the present invention, as well as other embodiments thereof, may be more clearly understood by reference to the following detailed description of the invention, to the appended claims, and to the several drawings herein, wherein:

FIG. 4 is a representation of an exemplary embodiment of a method for forming a supersaturated silicon dioxide solution for passivating a silicon surface in accordance with a method of the present invention; and FIG. 5 is a representation of the processes of another embodiment of forming a supersaturated silicon dioxide solution for passivating a silicon surface in accordance with a method of the present invention.

DETAILED DESCRIPTION OF THE INVENTION

Figure 1A:
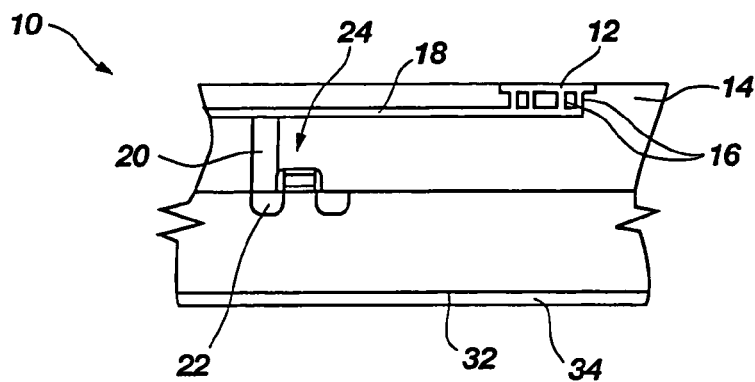
FIGS. 1A-1D are schematic cross-sectional representations through a semiconductor device, the back side of which is depicted with a passivation layer applied in accordance with a method of the present invention.

With reference to FIGS. 1A-1D and 2A-2C, different types of bond pads 12, 12' that are typically used in semiconductor devices 10, 10' are depicted. In FIG. 1A, a semiconductor device which includes copper bond pads 12 is shown. Copper bond pads 12 are typically formed on a passivation layer 14 of semiconductor device 10 and communicate with underlying, integrated circuitry of semiconductor device 10. By way of example, one or more generally downwardly extending conductive vias 16 may establish electrical communication with conductive traces 18, or "runners," that, in turn, electrically communicate with the integrated circuitry of semiconductor device 10. For example, runners 18 may lead to contact plugs 20 that provide a conductive link between runners 18 and a conductively doped silicon active-device region 22 of a transistor 24 of semiconductor device 10.

In order to use a rapid electroless plating method to plate bond pads 12, 12' without incurring damage to the semiconductor device 10, it is necessary to insulate the net positive (+) charge on the semiconductor device's back side 32. FIG. 1A also shows a back side passivation layer 34 of silicon dioxide that has been formed in accordance with teachings of the present invention. In FIG. 1A, a back side passivation layer 34 of silicon dioxide has been formed by a method of this invention to electrically insulate the back side 32, preventing etching of bond pad 12, as well as other possible damage to the circuits of semiconductor devices 10 by, for example, short circuiting during plating of bond pads 12.

Figure 1B:
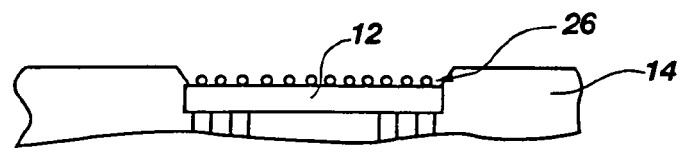
Figure 1C:
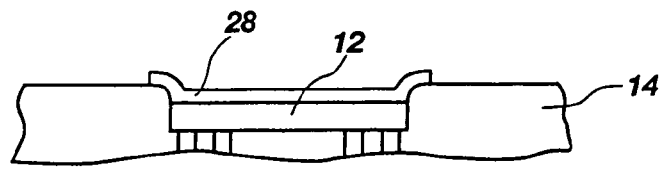
Figure 1D:
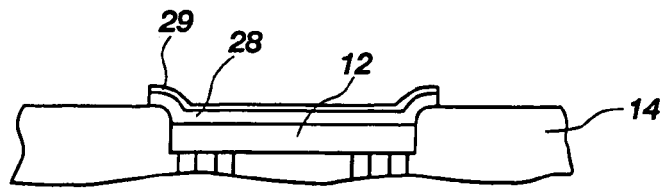

Once back side passivation layer 34 has been formed, a palladium activation layer 26 may be formed thereon, as depicted in FIG. 1B, such as by the aggressive, acid-accelerated electroless plating processes described previously herein. A layer 28 of electrolessly deposited nickel may then be formed on each bond pad 12, as shown in FIG. 1C, followed by a layer 29 of immersion plated gold, as illustrated in FIG. 1D. Following plating of bond pads 12, the upper surface of semiconductor device 10 may be further covered with a passivation and/or final package. It is understood that semiconductor device 10, as shown, is part of a multi-semiconductor device wafer containing a plurality, e.g., hundreds, of semiconductor devices, although the method is applicable to a single discrete semiconductor device as well.

Figure 2A:
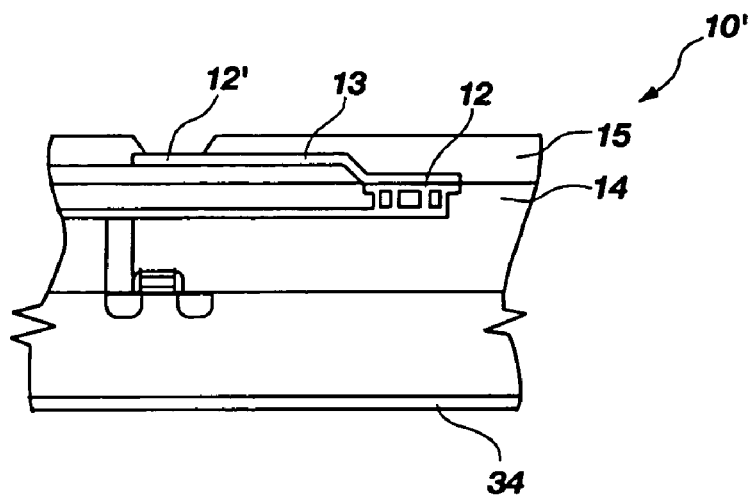
FIGS. 2A-2C are schematic cross-sectional representations through another semiconductor device, the back side of which is depicted with a passivation layer applied in accordance with teachings of the present invention.

FIG. 2A illustrates a semiconductor device 10' with each of the features of semiconductor device 10 (FIG. 1A). In addition, semiconductor device 10' includes another passivation layer 15 that overlies passivation layer 14 and each bond pad 12 exposed therethrough, a redistributed bond pad 12' exposed through passivation layer 15, and a conductive redistribution trace 13 extending between passivation layer 14 and passivation layer 15 from bond pad 12 to its corresponding redistributed bond pad 12'. Redistributed bond pad 12' may be configured to receive a discrete conductive element (not shown), such as a solder ball, and, therefore, may be formed from aluminum or another material suitable for securing such a discrete conductive element. Semiconductor device 10' also includes a back side passivation layer 34 on a back side thereof.

Figure 2B:
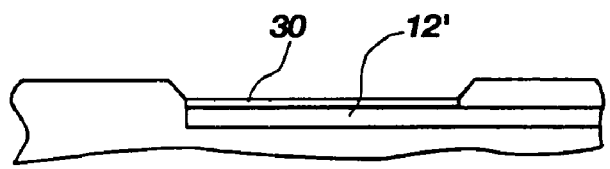
Figure 2C:
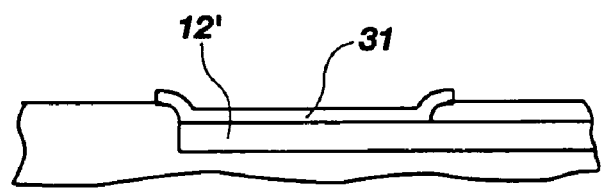

As shown in FIGS. 2B and 2C, a zincate process may be conducted on redistributed bond pad 12' (FIG. 2B) to form zinc grains 30 thereon, which facilitate adherence of an electrolessly deposited nickel layer 31 to redistributed bond pad 12' (FIG. 2C).

Figure 3:
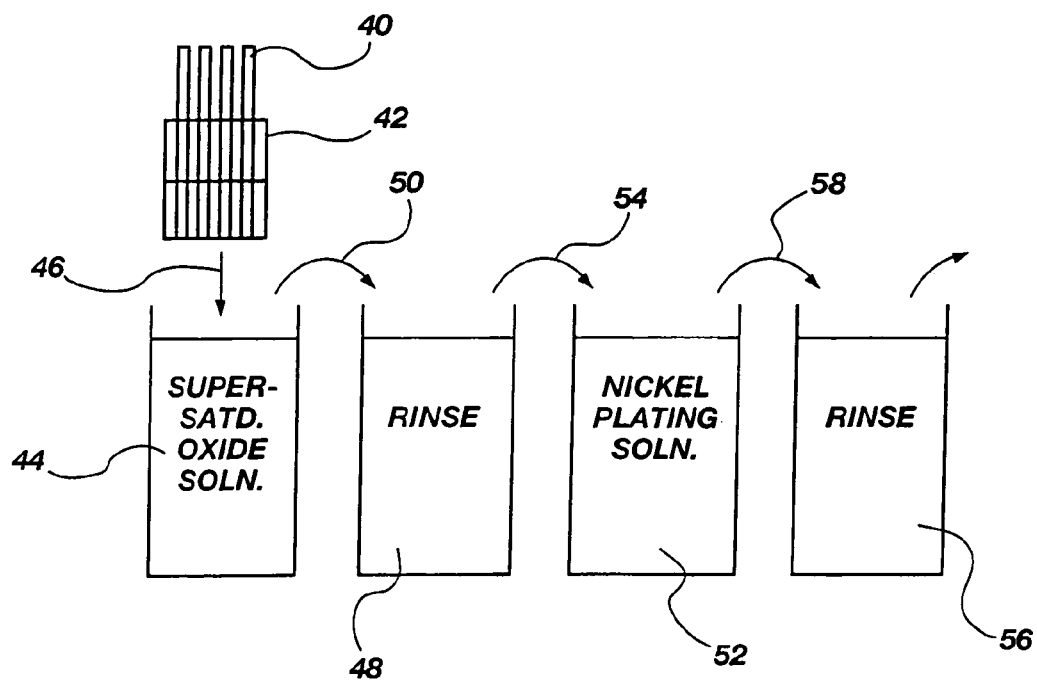
FIG. 3 is a schematic representation of a method for forming a passivation layer on silicon in accordance with the present invention and subsequent plating of bond pads of a semiconductor device.

Turning now to FIG. 3, one or more semiconductor wafers 40 are shown in a wafer carrier 42 for forming a back side silicon dioxide layer. First, at reference 46, the wafers 40 are immersed in a supersaturated silicon dioxide solution 44 to precipitate, i.e., deposit a dense passivation layer 34 (see FIGS. 1A and 2A) on the back side 32 of each wafer 40. The deposition is specific to exposed silicon (and its oxide), and substantially does not plate out on bond pads 12, 12' (FIGS. 1A and 2A, respectively) or on organic materials, such as photoresist. However, in the event that minute quantities of silicon dioxide are found to adhere to bond pads 12, 12', the latter may be precovered with tape to prevent deposition thereto. The back sides 32 of wafers 40 are shown as being in a vertical position during immersion. However, the wafer orientation appears to be irrelevant to deposition rate or layer properties in this process, as long as constant exposure to the solution 44 is maintained.

In the submersion process 46, the following factors are controlled:

a. The concentration of components in the supersaturated silicon dioxide solution 44 is controlled to provide sufficient silicon dioxide for the desired layer depth and insulative value. Inasmuch as deposition is specific to surfaces of silicon and its oxide, the required solution composition may be readily calculated.

b. During submersion, the solution temperature generally may be between about room temperature and about 50° C. While the temperature may be even higher, e.g., up to about 90° C., there may be no reason to control the temperature at much above room temperature in most cases.

c. The time of submersion is relatively short, typically on the order of about 1 minute to about 60 minutes, depending upon the particular application. Some applications may require longer immersion times to achieve the desired layer thickness. The deposition rate has been found to be independent of the layer thickness, but may attain a "steady-state" thickness upon long-term exposure.

d. The pressure at which the exposure takes place is preferably atmospheric, or nearly so, requiring no special control.

During submersion of the wafers 40, the supersaturated silicon dioxide solution 44 is preferably stirred or recycled to prevent local depletion of silicon dioxide and provide fresh solution for coating the silicon surfaces.

Following formation of the back side passivation layer 34, the wafers 40 are extracted from the supersaturated silicon dioxide solution 44 and rinsed in rinsing apparatus 48 at reference 50. Solution remaining on the wafer surfaces is washed away including any hexafluorosilicic acid, unattached precipitated silicon dioxide, and stable complex-ion $BF_4^-$.

Optionally, the rinsed wafers 40 may be dried to prevent any dilution (though slight) of the subsequent plating solution 52. However, there is no need to heat-treat the wafers 40, such as is required by some layering processes.

As shown in FIG. 3, the bond pads 12, 12' (FIGS. 1A and 2A) may then be plated with nickel or other metal in an electroless process, from plating solution 52, in a plating represented at reference 54. Of course, such an electroless plating process may include activation or other preparation of the surface of bond pads 12, 12', as explained previously herein (e.g., palladium activation of copper, zincating aluminum, etc.) A subsequent rinsing process 58 is conducted using rinsing apparatus 56 before subsequent manufacturing processes, e.g., attachment of wires and packaging, are performed. Each of the indicated processes may be comprised of several subprocesses.

Alternative methods for forming the supersaturated silicon dioxide solution 44 are depicted in drawing FIGS. 4 and 5. As shown in the drawing figures, the aqueous reaction solution 44 comprises an acid fluoride salt of the desired oxide, whether silicon dioxide, zirconium oxide, etc., and the solution is supersaturated in the desired oxide by the addition of a buffer, e.g., boric acid. The reactions, which take place in the formation of solution 44, specific to silicon dioxide, are as follows:

$$H_2SiF_6 + 2H_2O \leftrightarrows SiO_2 + 6\ HF \quad \text{(Reaction A)}$$

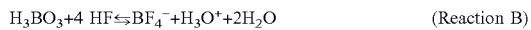
$$H_3BO_3 + 4\ HF \leftrightarrows BF_4^- + H_3O^+ + 2H_2O \quad \text{(Reaction B)}$$

It can be seen that in Reaction B, HF produced in Reaction A is consumed by the addition of boric ion to produce a stable complex ionic species $BF_4^-$ (as well as hydronium ion $H_3O^+$), driving Reaction A to the right. The result is supersaturation of the solution with respect to $SiO_2$, which deposits on the exposed silicon surface (and silicon dioxide surface).

As shown in FIG. 4, one method for making a supersaturated silicon dioxide solution is to first form an aqueous solution of hexafluorosilicic acid $H_2SiF_6$. The solution is formed at a generally high concentration, for example, about 20-50 weight percent $H_2SiF_6$. Silicon dioxide ($SiO_2$) is then added whereby, at equilibrium, the solution is saturated with respect to the oxide and contains hydrofluoric acid.

Any silicon dioxide which precipitates, together with any other solids, is then preferably removed from the solution 44 with, for example, a 0.2 μm filter. The result is a substantially solid-free solution 44 saturated in silicon dioxide.

The solution is then diluted with water. To this diluted solution 44 is added boric acid ($H_3BO_3$) at a concentration which will tie up the HF to supersaturate the solution in silicon dioxide. In this invention, a silicon-surfaced semiconductor device, wafer, interposer or other device is immersed in the supersaturated solution 44 for deposition of a silicon dioxide layer. Following completion of such deposition, the coated device is rinsed to remove extraneous materials and further processed to completion.

An alternate method of the present invention is shown in FIG. 5, in which the initial concentrated hexafluorosilicic acid is first diluted with water prior to saturating with silicon dioxide. Following filtration, the method may follow substantially the same process flow shown in FIG. 4.

The thickness of silicon dioxide layers that may be formed by the methods of the invention range up to about 100 nm in a single deposition. Typically, a desired layer thickness for passivating the back side of a semiconductor wafer may be about 100 to 500 Å (about 10 to about 50 nm), and other applications may use silicon dioxide layers of less than 100 Å thickness.

It should be noted that in either of the foregoing methods of the present invention of FIGS. 4 and 5, aluminum may be substituted for boric acid. In this case, the aluminum reacts with HF to form $AlF_3$, driving reaction A to the right to supersaturate the solution in silicon dioxide.

Thus far, the invention has been described in terms of a passivation layer comprising silicon dioxide. Other oxides may be formed which will deposit onto an exposed silicon surface, having similar chemical routes. For example, the layer-forming solution may be configured to deposit the oxides of zirconium, titanium, vanadium and even iron.

In another embodiment of the method of the present invention, a silicon dioxide-depositing solution may be formed by adding ammonia ($NH_3$) to a hexafluorosilicic acid solution whereby the solution becomes supersaturated in silicon dioxide.

In a first embodiment, already described, a passivating layer of silicon dioxide is formed on the back side of a semiconductor wafer, with many advantages over the prior art. The invention also encompasses the application of a passivating layer on the inner walls of a laser-formed via, on members such as carrier substrates, interposer substrates for flip-chip packaging, beneath interconnects for test packages, and the like. The method of the present invention is particularly useful for passivating vias and microvias such as made by lasers through silicon. The method of the present invention deposits a uniform layer of oxide on the silicon surfaces of the via hole, without covering metallization to which the via hole may extend. Previous methods tend to produce uneven deposition so that, in order to assure complete coverage, the layer must in some places be much thicker than desired. The uneven coverage also unduly limited the diameter of microvia holes. Use of the present invention avoids these problems, enabling uniform thin coatings within vias or microvias, formed easily, without prolonged exposure, and without covering nonsilicon surfaces.

Although the foregoing description contains many specifics, these should not be construed as limiting the scope of the present invention, but merely as providing illustrations of some exemplary embodiments. Similarly, other embodiments of the invention may be devised which do not depart from the spirit or scope of the present invention. Features from different embodiments may be employed in combination. The scope of the invention is, therefore, indicated and limited only by the appended claims and their legal equivalents, rather than by the foregoing description. All additions, deletions, and modifications to the invention, as disclosed herein, which fall within the meaning and scope of the claims are to be embraced thereby.

What is claimed is:

1. A method for forming a passivation layer on a semiconductor device component, comprising:

exposing at least a portion of at least one surface of the semiconductor device component, including at least one exposed feature comprising a semiconductor material or an oxide of the semiconductor material and at least another exposed feature comprising metal, to an aqueous solution supersaturated with an oxide of the semiconductor material to deposit the oxide on the at least one exposed feature without depositing the oxide on the at least another exposed feature; and exposing at least a portion of the at least one surface to a plating solution to plate the at least another exposed feature.

2. The method of claim 1, wherein exposing at least the portion of the at least one surface to the aqueous solution comprises at least partially immersing the semiconductor device component in the aqueous solution supersaturated with the oxide.

3. The method of claim 1, wherein exposing at least the portion of the at least one surface to the plating solution comprises at least partially immersing the semiconductor device component in the plating solution.

4. The method of claim 1, wherein exposing at least the portion of at least one surface to the plating solution comprises forming a solder wettable coating on the at least another exposed feature.

5. The method of claim 1, wherein exposing at least the portion of at least one surface to the aqueous solution comprises exposing at least one surface of a fabrication substrate carrying a plurality of semiconductor devices to the aqueous solution.

6. The method of claim 1, wherein exposing at least the portion of at least one surface to the aqueous solution comprises depositing the oxide to have a thickness of about 100 Å to about 500 Å.

7. The method of claim 1, wherein exposing at least the portion of at least one surface to the aqueous solution comprises exposing the at least one surface to a solution comprising a hexafluoro acid of the semiconductor material.

8. The method of claim 7, wherein exposing at least the portion of at least one surface to the aqueous solution comprises exposing at least the portion of the at least one surface to an aqueous solution comprising a buffer to facilitate supersaturation thereof with the oxide.

9. The method of claim 8, wherein exposing at least the portion of at least one surface to the aqueous solution comprises exposing at least the portion of the least one surface to an aqueous solution buffered with boric acid.

10. The method of claim 8, wherein exposing at least the portion of at least one surface to the aqueous solution comprises exposing at least the portion of the at least one surface to an aqueous solution comprising aluminum.

11. The method of claim 8, further comprising:
controlling a rate of deposition by varying a concentration of the buffer.

12. The method of claim 7, wherein exposing at least the portion of at least one surface to the aqueous solution comprises exposing at least the portion of the at least one surface to an aqueous solution comprising a hexafluorosilicic acid solution saturated with silicon dioxide, filtered to remove precipitated silicon dioxide, diluted with water, and supersaturated with silicon dioxide by the addition of boric acid.

13. The method of claim 7, wherein exposing at least the portion of at least one surface to the aqueous solution comprises exposing at least the portion of the at least one surface to an aqueous solution comprising a hexafluorosilicic acid solution which is diluted with water, saturated with silicon dioxide, filtered to remove precipitated silicon dioxide, and supersaturated with silicon dioxide by the addition of boric acid.

14. The method of claim 7, wherein exposing at least the portion of at least one surface to the aqueous solution comprises exposing at least the portion of the at least one surface to an aqueous solution comprising a hexafluorosilicic acid solution saturated with silicon dioxide, filtered to remove precipitated silicon dioxide diluted with water, and supersaturated with silicon dioxide by the addition of aluminum.

15. The method of claim 7, wherein exposing at least the portion of at least one surface to the aqueous solution comprises exposing at least the portion of the at least one surface to an aqueous solution comprising a hexafluorosilicic acid solution which is diluted with water, saturated with silicon dioxide, filtered to remove precipitated silicon dioxide, and supersaturated with silicon dioxide by the addition of aluminum.

16. The method of claim 1, wherein exposing at least the portion of at least one surface to the aqueous solution comprises exposing at least the portion of the at least one surface to an aqueous solution for about 1 minute to about 120 minutes.

17. The method of claim 1, wherein exposing at least the portion of at least one surface to the aqueous solution comprises exposing at least the portion of the at least one surface to an aqueous solution at a temperature of less than about 80° C.

18. The method of claim 1, wherein exposing at least the portion of at least one surface to the aqueous solution comprises exposing at least the portion of the at least one surface to an aqueous solution at a temperature of less than about 50° C.

19. The method of claim 1, wherein exposing at least the portion of at least one surface to the aqueous solution is conducted at substantially atmospheric pressure.

20. The method of claim 1, wherein exposing at least the portion of at least one surface to the plating solution comprises exposing at least the portion of the at least one surface to an electroless plating solution or an immersion plating solution.

21. The method of claim 1, wherein exposing at least the portion of at least one surface to the plating solution follows exposing at least the portion of the at least one surface to the aqueous solution.

22. The method of claim 21, wherein exposing at least the portion of at least one surface to the plating solution comprises plating the at least another exsposed feature without substantially degrading material of the at least another feature.

23. The method of claim 21, wherein exposing at least the portion of at least one surface to the plating solution comprises plating the at least another exsposed feature while conserving material of at least another feature and of the plating solution.

24. A method for passivating a surface of at least a portion of at least one aperture extending at least partially through a semiconductor substrate, comprising:

exposing at least a portion of the surface of the at least one aperture to an aqueous solution supersaturated with an oxide of a semiconductor material to deposit the oxide on portions of the surface comprising a semiconductor material of the semiconductor substrate or an oxide of the semiconductor material, without passivating features on the semiconductor substrate that do not comprise the semiconductor material or the oxide thereof.

25. The method of claim 24, wherein exposing comprises at least partially immersing the semiconductor substrate in the aqueous solution.

26. The method of claim 24, wherein exposing comprises immersing the semiconductor substrate.

27. The method of claim 24, wherein exposing is effected with the aqueous solution at a temperature of about 0° C. to about 100° C.

28. The method of claim 24, wherein exposing is effected until a passivation layer having a thickness of about 100 Å to about 500 Å is formed on at least the portion of the surface.

29. The method of claim 24, wherein exposing comprises exposing at least the portion of the surface to an aqueous solution comprising a buffer to facilitate supersaturation of the aqueous solution with the oxide.

30. The method of claim 29, wherein exposing comprises exposing at least the portion of the surface with the buffer of the aqueous solution comprising at least one of boric acid and aluminum.

31. A method for passivating at least a portion of at least one surface of at least one aperture in a semiconductor substrate, comprising:
forming the at least one aperture in the semiconductor substrate; and
exposing at least the portion of the surface of at least one aperture to an aqueous solution supersaturated with an oxide of a semiconductor material to passivate a surface of the at least one aperture without passivating surfaces of features carried by the semiconductor substrate that do not comprise a semiconductor material of the semiconductor substrate or an oxide of the semiconductor material.

32. The method of claim 31, wherein exposing comprises at least partially immersing the semiconductor substrate in the aqueous solution.

33. The method of claim 31, wherein exposing comprises introducing the aqueous solution into the at least one aperture.

34. The method of claim 31, wherein exposing is effected until a passivation layer having a thickness of about 100 Å to about 500 Å is formed on at least the portion of the surface.

35. The method of claim 31, wherein exposing comprises exposing at least the portion of the at least one surface to an aqueous solution further comprising boric acid.

36. The method of claim 31, wherein exposing comprises exposing at least the portion of the at least one surface to an aqueous solution further comprising aluminum.

37. The method of claim 31, wherein exposing comprises exposing at least the portion of the at least one surface to an aqueous solution comprising a hexafluoro acid of the semiconductor material.

* * * * *

UNITED STATES PATENT AND TRADEMARK OFFICE
CERTIFICATE OF CORRECTION

PATENT NO. : 7,312,164 B2 Page 1 of 1
APPLICATION NO. : 11/087212
DATED : December 25, 2007
INVENTOR(S) : Lindgren It is certified that error appears in the above-identified patent and that said Letters Patent is hereby corrected as shown below:

On the title page, in field (56), under "Other Publications", in column 2, line 2, delete "Fim" and insert -- Film --, therefor.

In column 10, line 9, in Claim 14, after "dioxide" insert -- , --.

In column 10, line 49, in Claim 22, delete "exsposed" and insert -- exposed --, therefor.

In column 10, line 50, in Claim 22, after "another" insert -- exposed --.

In column 10, line 54, in Claim 23, delete "exsposed" and insert -- exposed --, therefor.

In column 10, line 55, in Claim 23, after "another" insert -- exposed --.

Signed and Sealed this

Twenty-ninth Day of April, 2008

JON W. DUDAS
*Director of the United States Patent and Trademark Office*